United States Patent
Hiraga et al.

(10) Patent No.: US 9,985,146 B2
(45) Date of Patent: May 29, 2018

(54) PHOTOELECTRIC CONVERSION DEVICE, AND SOLAR CELL

(71) Applicant: Kabushiki Kaisha Toshiba, Minato-ku (JP)

(72) Inventors: Hiroki Hiraga, Kawasaki (JP);
Soichiro Shibasaki, Nerima (JP);
Naoyuki Nakagawa, Setagaya (JP);
Mutsuki Yamazaki, Yokohama (JP);
Kazushige Yamamoto, Yokohama (JP);
Shinya Sakurada, Shinagawa (JP);
Michihiko Inaba, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 14/857,361

(22) Filed: Sep. 17, 2015

(65) Prior Publication Data

US 2016/0087125 A1    Mar. 24, 2016

(30) Foreign Application Priority Data

Sep. 19, 2014  (JP) ................... 2014-191891

(51) Int. Cl.
*H01L 31/0216* (2014.01)
*H01L 31/0224* (2006.01)
*H01L 31/0749* (2012.01)

(52) U.S. Cl.
CPC .. *H01L 31/02168* (2013.01); *H01L 31/02167* (2013.01); *H01L 31/022425* (2013.01);

(Continued)

(58) Field of Classification Search
CPC ......... H01L 31/02167; H01L 31/02168; H01L 31/022466; H01L 31/022475; H01L 31/022483; Y02E 10/50

(Continued)

(56) References Cited

U.S. PATENT DOCUMENTS

| | | | | |
|---|---|---|---|---|
| 2003/0102023 | A1* | 6/2003 | Delahoy | ............. H01L 31/0322 136/262 |
| 2006/0137735 | A1* | 6/2006 | Kobayashi | ........ G02F 1/133504 136/246 |

(Continued)

FOREIGN PATENT DOCUMENTS

| | | |
|---|---|---|
| CN | 102433545 | 5/2012 |
| CN | 102714228 | 10/2012 |

(Continued)

OTHER PUBLICATIONS

Ruby et al. "ZnO nanostructures as efficient antireflection layers in solar cells". Nano Letters. 2008. vol. 8, No. 5, 1501-1505.*

(Continued)

*Primary Examiner* — Lindsey Bernier
(74) *Attorney, Agent, or Firm* — Oblon, McClelland, Maier & Neustadt, L.L.P.

(57) ABSTRACT

A photoelectric conversion device of an embodiment has a substrate, a bottom electrode on the substrate, a light absorbing layer on the bottom electrode, an n-type layer on the light absorbing layer, a transparent electrode on the n-type layer, and an oxide layer on the transparent electrode. $n_A$ and $n_B$ satisfy the relation $100/110 \leq n_B/n_A \leq 110/100$. $n_A$ is the refractive index of the transparent electrode. $n_B$ is the refractive index of the oxide layer.

10 Claims, 2 Drawing Sheets

(52) U.S. Cl.
 CPC ........... *H01L 31/022466* (2013.01); *H01L 31/022475* (2013.01); *H01L 31/022483* (2013.01); *H01L 31/0749* (2013.01); *Y02E 10/50* (2013.01); *Y02E 10/541* (2013.01)

(58) Field of Classification Search
 USPC .............................. 136/252, 257, 256, 265
 See application file for complete search history.

(56) References Cited

U.S. PATENT DOCUMENTS

| | | | |
|---|---|---|---|
| 2009/0007966 A1 | 1/2009 | Isaka et al. | |
| 2010/0170556 A1* | 7/2010 | Frolov ............... | H01L 31/042 136/244 |
| 2010/0180941 A1 | 7/2010 | Lim et al. | |
| 2010/0210062 A1* | 8/2010 | Kim ................... | H01G 9/209 438/71 |
| 2011/0126875 A1* | 6/2011 | Le ..................... | C23C 14/0036 136/244 |
| 2011/0174362 A1 | 7/2011 | Tanner et al. | |
| 2011/0177648 A1* | 7/2011 | Tanner ............... | H01L 21/67236 438/72 |
| 2012/0015147 A1* | 1/2012 | Maa .................. | H01L 31/0236 428/148 |
| 2012/0024378 A1* | 2/2012 | Lee ................... | H01L 31/02168 136/259 |
| 2012/0048364 A1* | 3/2012 | Auvray .............. | H01L 31/02168 136/256 |
| 2012/0080090 A1* | 4/2012 | Thomsen ........... | H01L 31/02246 136/260 |
| 2014/0034126 A1 | 2/2014 | Yang et al. | |
| 2014/0144510 A1 | 5/2014 | Hiraga et al. | |

FOREIGN PATENT DOCUMENTS

| | | |
|---|---|---|
| EP | 2 693 487 A2 | 2/2014 |
| JP | 06-125103 | 5/1994 |
| JP | 07-235684 | 9/1995 |
| JP | 10-190028 | 7/1998 |
| JP | 11-298016 | 10/1999 |
| JP | 2003-123859 | 4/2003 |
| JP | 2003-152200 | 5/2003 |
| JP | 2003-179241 | 6/2003 |
| JP | 2003-197937 | 7/2003 |
| JP | 2003-298088 | 10/2003 |
| JP | 2005-064273 | 3/2005 |
| JP | 2006-128258 | 5/2006 |
| JP | 2010-067956 | 3/2010 |
| JP | 2012-146873 | 8/2012 |
| JP | 2013-065595 | 4/2013 |
| JP | 2014-103264 A | 6/2014 |
| WO | WO 2012/044342 | 4/2012 |

OTHER PUBLICATIONS

Extended European Search Report dated Feb. 5, 2016 in Patent Application No. 15185635.8.
Tokio Nakada et al., "Novel Device Structure for Cu(In,Ga)Se$_2$ Thin Film Solar Cells Using Transparent Conducting Oxide Back and Front Contacts", Solar Energy 77 (2004), pp. 739-747.

\* cited by examiner

PHOTOELECTRIC CONVERSION DEVICE, AND SOLAR CELL

CROSS-REFERENCE TO RELATED APPLICATION

This application is based upon and claims the benefit of priority from Japanese Patent Application No. 2014-191891 filed on Sep. 19, 2014; the entire contents of which are incorporated herein by reference.

FIELD

Embodiments described herein relate to a photoelectric conversion device and a solar cell.

BACKGROUND

Compound photoelectric conversion devices having a semiconductor thin film as a light absorbing layer have been developed. In particular, thin-film photoelectric conversion devices having, as a light absorbing layer, a p-type semiconductor layer with a chalcopyrite structure have high conversion efficiency and thus promising applications. Specifically, thin-film photoelectric conversion devices having a light absorbing layer of $Cu(In,Ga)Se_2$ as a Cu—In—Ga—Se compound, $Cu(In,Al)Se_2$ as a Cu—In—Al—Se compound, $Cu(Al,Ga)Se_2$ as a Cu—Al—Ga—Se compound, or $CuGaSe_2$ as a Cu—Ga—Se compound have relatively high conversion efficiency. A thin-film photoelectric conversion device has alight absorbing layer of a p-type semiconductor layer with a chalcopyrite structure, a kesterite structure, or a stannite structure. Such a thin-film photoelectric conversion device generally has a structure including a soda-lime glass substrate, and a molybdenum bottom electrode, a p-type semiconductor layer, an n-type semiconductor layer, an insulating layer, a transparent electrode, a top electrode, and an antireflective film, which are stacked on the substrate. The conversion efficiency $\eta$ is expressed by $\eta=Voc \cdot Jsc \cdot FF/P \cdot 100$, wherein Voc is open-circuit voltage, Jsc is short-circuit current density, FF is power factor, and P is incident power density.

This shows that the conversion efficiency increases as the open-circuit voltage, the short-circuit current, and the power factor increase, respectively. Theoretically, as the band gap between the light absorbing layer and the n-type semiconductor layer increases, the open-circuit voltage increases, whereas the short-circuit current density decreases. It is known that the band gap of $Cu(In,Ga)Se_2$ increases with Ga concentration and when Ga/(In+Ga) is controlled about 0.3, the band gap of $Cu(In,Ga)Se_2$ becomes about 1.05 eV. It is known a photoelectric conversion device with high conversion efficiency can be obtained when Ga/(In+Ga) is near to above mentioned value.

Sputtering, vapor deposition, or MOCVD (Metal Organic Chemical Vapor Deposition) is applied for forming the transparent electrode. When a thickness of the transparent electrode is 1 μm or more, interference colors occurs and an optical absorption reduces, these can be reasons for a reduction in the conversion efficiency. Then, processes for reducing optical absorption loss, for example, forming an antireflective film such as NaF on the transparent electrode are applied. However alternative material or method is desired because such processes increase material cost and number of process.

DETAILED DESCRIPTION

A photoelectric conversion device of an embodiment has a substrate, a bottom electrode on the substrate, a light absorbing layer on the bottom electrode, an n-type layer on the light absorbing layer, a transparent electrode on the n-type layer, and an oxide layer on the transparent electrode. $n_A$ and $n_B$ satisfy the relation $100/110 \leq n_B/n_A \leq 110/100$. $n_A$ is the refractive index of the transparent electrode. $n_B$ is the refractive index of the oxide layer.

The solar cell of an embodiment has a photoelectric conversion device. The photoelectric conversion device has a substrate, a bottom electrode on the substrate, a light absorbing layer on the bottom electrode, an n-type layer on the light absorbing layer, a transparent electrode on the n-type layer, and an oxide layer on the transparent electrode. $n_A$ and $n_B$ satisfy the relation $100/110 \leq n_B/n_A \leq 110/100$. $n_A$ is the refractive index of the transparent electrode. $n_B$ is the refractive index of the oxide layer.

Hereinafter, embodiments will be described in detail with reference to the drawings.

(Photoelectric Conversion Device)

Figure 1:
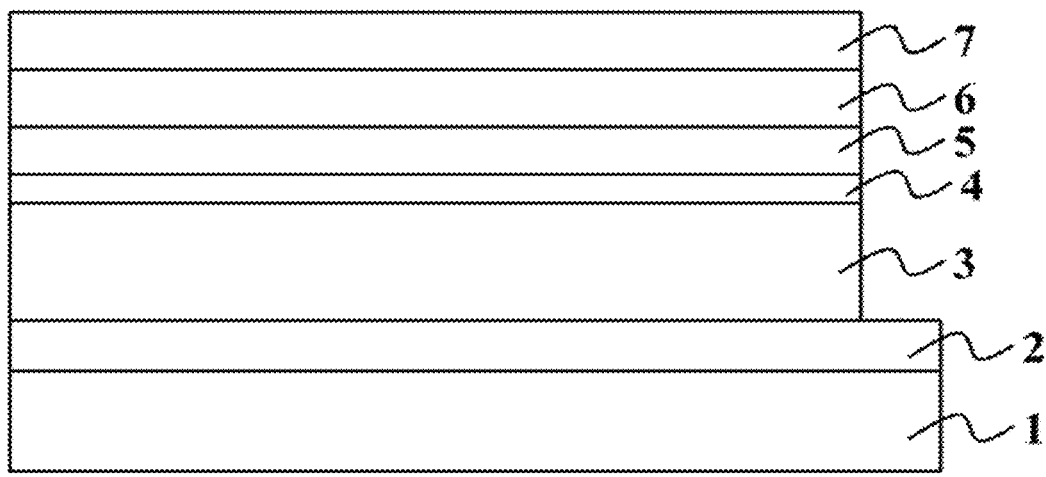
FIG. 1 is a schematic cross-sectional view of a thin-film photoelectric conversion device according to an embodiment.
Figure 2:
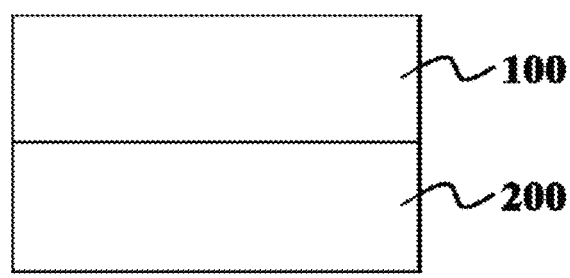
FIG. 2 is a schematic cross-sectional view of a multi-junction photoelectric conversion device according to an embodiment.

FIG. 1 is a schematic diagram showing a photoelectric conversion device 100 according to an embodiment. The photoelectric conversion device 100 is a thin-film type photoelectric conversion device including a substrate 1, a bottom electrode 2 formed on the substrate 1, a p-type light absorbing layer 3 formed on the bottom electrode 2, an n-type layer 4 formed on the p-type light absorbing layer 3, a window layer 5 formed on the n-type layer 4, a transparent electrode 6 formed on the window layer 5, and an oxide layer 7 formed on the transparent electrode 6. Although not shown, the transparent electrode 6 is connected to an electrically-conductive extraction electrode. Specifically, the photoelectric conversion device 100 may be a solar cell. As shown in FIG. 2, the photoelectric conversion device 100 of an embodiment may be joined to another photoelectric conversion device 200 to form a multi-junction device. The light absorbing layer 3 of the photoelectric conversion device 100 preferably has a band gap wider than that of the light absorbing layer of the photoelectric conversion device 200. For example, Si is used to form the light absorbing layer of the photoelectric conversion device 200.

(Substrate)

The substrate 1 is provided to support the photoelectric conversion device. In an embodiment, the substrate 1 is preferably made of soda-lime glass, and alternatively, the substrate 1 may be made of a sheet of a metal such as stainless steel, Ti (titanium), or Cr (chromium), or a resin such as polyimide.

(Bottom Electrode)

In an embodiment, the bottom electrode 2 as an electrode of the photoelectric conversion device 100 is a metal film or a transparent conductive film formed on the substrate 1. The bottom electrode 2 may be a film of a conductive metal such as Mo or W or a film of a transparent conductive oxide such as indium tin oxide (ITO), silicon oxide, or tin oxide. In particular, the bottom electrode 2 is preferably a Mo film. The bottom electrode 2 may be a metal film, a conductive oxide film, or a multilayer film including a stack of these films. A specific example of the multilayer film may be Mo—SnO—ITO—SiO$_2$ in order from the light absorbing layer 3 side. The bottom electrode 2 can be deposited on the substrate 1 using a known method such as sputtering of a metal film material. The bottom electrode 2 typically has a thickness of 500 nm to 1,000 nm.

(P-Type Light Absorbing Layer)

In an embodiment, the p-type light absorbing layer 3 is a p-type compound semiconductor layer 3. The p-type light absorbing layer 3 is formed on the principal surface of the bottom electrode 2 opposite to the substrate 1. The p-type light absorbing layer 3 may be a layer of a compound semiconductor including a group Ib element or elements, a group IIIb element or elements, and a group VIb element or elements and having a chalcopyrite structure, a stannite structure, or a kesterite structure, such as CIGS, CIT, or CZTS. The p-type light absorbing layer 3 typically has a thickness of 1,000 nm to 3,000 nm. The group Ib element or elements preferably include Cu (copper) or Ag (silver). The group IIIb element or elements preferably include at least one element selected from the group consisting of Al, In, and Ga. The group VIb element or elements preferably include at least one element selected from the group consisting of O, S, Se, and Te, more preferably include at least Se. Among the group IIIb elements, In is more preferred because the band gap can be set to a desired level by using In in combination with Ga. Specifically, the light absorbing layer 3 may include a compound semiconductor such as Cu(In,Ga)(S,Se)$_2$, Cu(In,Ga)(Se,Te)$_2$, Cu(In,Ga)$_3$(Se,Te)$_5$, Cu(Al,Ga,In)Se$_2$, or Cu$_2$ZnSnS$_4$, more specifically, Cu(In,Ga)Se$_2$, CuInSe$_2$, CuInTe$_2$, CuGaSe$_2$, or CuIn$_3$Te$_5$, which may have any composition ratio. A compound composed of elements contained in the bottom electrode 2 and the light absorbing layer 3, respectively, is preferably present between them.

In an embodiment, the light absorbing layer 3 may be formed by a thin-film forming method such as sputtering, vapor deposition, or selenization sulfurization.

Vapor deposition is preferably performed in a high-vacuum atmosphere at a temperature of the substrate 1 (a member composed of the substrate 1 and the bottom electrode 2 formed thereon) of 10° C. to 600° C., more preferably 400° C. to 560° C. If the temperature of the substrate 1 is too low, the p-type light absorbing layer will be formed with poor crystallinity. On the other hand, if the temperature is too high, the light absorbing layer 3 can have excessively large crystal grains, which can be a cause of a reduction in the conversion efficiency of the photoelectric conversion device. After the deposition of the light absorbing layer 3, annealing may also be performed to control the growth of crystal grains.

(N-Type Semiconductor Layer)

In an embodiment, the n-type layer 4 is an n-type semiconductor layer. The n-type layer 4 is formed on the principal surface of the p-type light absorbing layer 3 opposite to the bottom electrode 2. The n-type layer is preferably an n-type semiconductor whose Fermi level is so controlled that the photoelectric conversion device can have a high open-circuit voltage. The n-type layer 4 forms a homojunction or a heterojunction with the p-type light absorbing layer 3. The n-type layer 4 may be any one of a semiconductor layer formed on the p-type light absorbing layer 3 or a layer formed by doping a certain region of the p-type light absorbing layer 3 (p-type compound semiconductor layer) as an original part with a dopant to convert the p-type to the n-type. When a semiconductor layer is formed as the n-type layer 4 on the p-type light absorbing layer 3, the semiconductor layer typically has a thickness of 10 nm to 60 nm. The n-type layer 4 may include CdS, Zn(O,S,OH), Mg-doped ZnO, Zn(O,S) doped with at least one element selected from the group consisting of B (boron), Al, In, and Ga as dopants, ZnMgO doped with any of these elements, or n-type GaP with a controlled carrier density. When the n-type layer 4 is formed by doping a certain region of the p-type light absorbing layer 3 as an original part with a dopant to convert the p-type to the n-type, the thickness of the n-type layer 4 is preferably 1 nm to 500 nm.

Examples of the n-type layer 4 forming method other than the doping method include sputtering, vapor deposition, chemical vapor deposition (CVD), chemical bath deposition (CBD), coating, and the like.

When the n-type semiconductor layer is formed by CBD, the deposition is preferably performed at a temperature of 50° C. to 90° C., more preferably 60° C. to 80° C. If the substrate 1 temperature is too low, the quality of the formed n-type semiconductor layer or the film production rate will be low, and contrary if the temperature is too high, it will be difficult to control the thickness of the n-type semiconductor layer as desired. The n-type semiconductor layer is a dense crystalline layer.

The method of doping part of the p-type light absorbing layer 3 with a dopant to convert the p-type to the n-type may be an immersion method. The p-type light absorbing layer 3 side of the member obtained after the formation of the p-type light absorbing layer 3 may be immersed and kept in a solution containing Cd (cadmium) as an n-dopant, counter ions, and ammonia water or any other medium (e.g., a cadmium sulfate solution) at 0° C. to 90° C. for several minutes to several tens of hours. After taken out of the solution, the treated member is preferably dried.

(Window Layer)

In an embodiment, the window layer 5 is formed on the principal surface of the n-type layer 4 opposite to the p-type light absorbing layer 3. The window layer 5 may be an i-type high-resistance (semi-insulating) layer provided between the transparent electrode 6 and the n-type layer 4. The window layer 5 may include one or more compounds selected from ZnO, MgO, (Zn$_a$Mg$_{1-a}$)O, InGa$_b$Zn$_a$O$_c$, SnO, InSn$_d$O$_c$, TiO$_2$, and ZrO$_2$. The letters a, b, c, and d preferably satisfy 0<a<1, 0<b<1, 0<c<1, and 0<d<1, respectively. The high-resistance layer provided between the transparent electrode 6 and the n-type layer 4 is advantageous in that it can reduce the leakage current from the n-type layer 4 to the transparent electrode 6 and improve the conversion efficiency. It is not preferable to make the window layer 5 too thick because the compound or compounds used to form the window layer 5 include a high-resistance compound. If the window layer 5 is too thin, the effect of reducing the leakage current will be substantially lost. Therefore, the window layer 5 should preferably have an average thickness of 5 nm to 100 nm. Note that the window layer 5 may be omitted.

The method of forming the window layer 5 may be CVD, spin coating, dipping, vapor deposition, sputtering, or the like.

When CVD is used, the window layer 5 may be formed as an oxide thin film by the following method. The member obtained after the formation of the n-type layer 4 is placed in a chamber. While the member is heated, an organometallic compound containing at least one of Zn, Mg, In, Ga, Sn, Ti, and Zr, and water or the like are introduced into the chamber and allowed to react on the n-type layer 4 to form an oxide thin film.

When spin coating is used, the window layer 5 may be formed as an oxide thin film by the following method. A solution containing oxide particles or an organometallic compound containing at least one of Zn, Mg, In, Ga, Sn, Ti, and Zr is applied by spin coating to the member obtained after the formation of the n-type layer 4. In a drier, the coating is then heated or allowed to react to form an oxide thin film.

When dipping is used, the window layer 5 may be formed as an oxide thin film by the following method. The n-type layer 4 side of the member obtained after the formation of the n-type layer 4 is dipped in the same solution as used in the spin coating method. After a desired period of time, the member is taken out of the solution. After the member is taken out, the solution on the member is heated or allowed to react to form an oxide thin film.

When vapor deposition is used, the window layer 5 may be formed as a compound thin film by the following method. A material for the window layer 5 is sublimed by resistance heating, laser irradiation, or the like and deposited as an oxide thin film. In a sputtering method, a target is sputtered by plasma to form the window layer 5.

Among CVD, spin coating, dipping, vapor deposition, and sputtering, spin coating and dipping are preferred deposition methods because they are less damaging to the n-type layer 4 or the p-type light absorbing layer 3 and will not form recombination centers in the n-type layer 4 or the p-type light absorbing layer 3 so that a high efficiency can be achieved.

(Transparent Electrode)

In an embodiment, the transparent electrode 6 is a film electrically conductive and transparent for light such as sunlight. For example, the transparent electrode 6 preferably includes ZnO:Al (aluminum-doped zinc oxide) containing 2 wt % to 20 wt % of alumina ($Al_2O_3$), ZnO:B (B-doped zinc oxide) containing 2 wt % to 20 wt % of B as a dopant derived from diborane, or $In_2O_3$:Sn (tin oxide-doped indium oxide) containing 2 wt % to 25 wt % of tin oxide (SnO). The transparent electrode 6 is a dense, oriented, highly-crystalline film formed by vapor deposition, sputtering, or the like.

It is not preferable to make the transparent electrode 6 too thick because carrier absorption can occur at some wavelengths (e.g., long wavelengths of 1,100 nm or more) in the transparent electrode 6. The transparent electrode 6 preferably has a thickness of 1 µm or less. The thickness of the transparent electrode 6 is preferably from 50 nm to 500 nm. If the transparent electrode 6 is too thick, carrier absorption can increase in the transparent electrode 6, which is not preferred. Carrier absorption can cause the photoelectric conversion device 100 to generate heat, so that it can easily reach a high temperature during long-term exposure to sunlight, and such a high temperature can reduce the conversion efficiency, which is not preferred. If the transparent electrode 6 is too thin, interference colors can occur to cause an optical absorption loss. In the photoelectric conversion device 100 of an embodiment, therefore, the oxide layer 7 is provided on the thin transparent electrode 6, in which the oxide layer 7 differs from the transparent electrode 6. This feature makes it possible to reduce carrier absorption without forming an antireflective film such as NaF and also makes it possible to improve the photoelectric conversion efficiency by reducing or eliminating interference colors.

(Oxide Layer)

In order to reduce interference colors, the oxide layer 7 preferably includes oxide particles with a refractive index whose difference from that of the transparent electrode 6 placed under it falls within ±10% of that of the transparent electrode 6. By increasing the amount of the dopant in the transparent electrode 6, the refractive index can be reduced and the difference in refractive index can be controlled. Specifically, it is preferable to satisfy the relation $100/110 \leq n_7/n_6 \leq 110/100$, wherein $n_6$ is the refractive index of the transparent electrode 6, and $n_7$ is the refractive index of the oxide layer 7. The refractive indices of the transparent electrode 6 and the oxide layer 7 more preferably satisfy the relation $100/105 \leq n_7/n_6 \leq 105/100$. The difference between the refractive index $n_6$ of the transparent electrode 6 and that of the oxide layer 7 is preferably as small as possible, so that the effect of reducing interference colors can be outstanding. In addition, the oxide layer 7 preferably has a resistance higher than that of the transparent electrode 6. The oxide layer 7 more preferably includes high-resistance oxide particles, so that carrier absorption at a wavelength of about 1,100 nm can be reduced.

In the oxide layer 7, oxide particles preferably have an average diameter of 3 nm to 100 nm. Oxide particles with diameters in this range are more preferred because they are highly handleable when the oxide layer 7 is formed. For example, the oxide particles used to form the oxide layer 7 are preferably made of zinc oxide when the transparent electrode 6 is made of ZnO:Al or ZnO:B, and they are preferably made of indium oxide when the transparent electrode 6 is made of $In_2O_3$:Sn. The oxide layer 7 may also be made of a complex oxide if the refractive index conditions are satisfied. The oxide layer 7 may also be made of Al- or B-doped zinc oxide if the refractive index conditions are satisfied. The oxide layer 7 may also be made of Sn-doped indium oxide if the refractive index conditions are satisfied. When compounds of the same type are used in combination in this way, the refractive index difference can be kept in the preferred range. When the oxide layer 7 is provided on the transparent electrode 6, the oxide layer 7 preferably has a thickness enough to reduce carrier absorption, when the transparent electrode 6 has a thickness of 1 µm or less, and to eliminate interference colors, when the oxide layer 7 and the transparent electrode 6 have a total thickness of 1,000 nm to 2 µm. The oxide layer 7 may be made of any type of oxide if the refractive index conditions are satisfied and preferably if the total thickness of the oxide layer 7 and the transparent electrode falls within the preferred range. The oxide layer 7 can be formed by spin coating, spraying, sputtering, CVD, or the like.

The refractive index can also be determined by ellipsometry.

The cross-section of the central part of the photoelectric conversion device 100 may be subjected to secondary ion-microprobe mass spectrometry (SIMS) or transmission electron microscope-energy dispersive X-ray spectroscopy (TEM-EDX) for quantitative analysis of each layer such as the light absorbing layer 3, so that the composition ratio of each layer can be determined. The composition ratio may be determined not only from the values measured in the thickness direction of the layer at one measurement site but also from the averages of the values measured in the thickness direction of the layer at two or more measurement sites close to one another.

The average diameter of crystals in each layer such as the light absorbing layer 3 can be determined from a cross-sectional scanning electron microscope (SEM) image of the central part of the photoelectric conversion device. The cross-sectional image can be obtained by the SEM observation of the cross-section. The central part of the layer to be measured is subjected to cross-sectional SEM observation at a magnification of 20,000. In the observed image, the area of each particle is measured in a 2-μm-wide region, and the average diameter is calculated from the diameters of perfect circles whose areas are the same as those of the measured particles. The thickness of each layer of the photoelectric conversion device 100 can also be determined by cross-sectional SEM observation. The observed region is equally divided into five areas, and the thickness of the central part in each of the five areas is measured. The average of the measured values may be used as the thickness of the measured layer. The interface of each layer can be identified with reference to grain boundaries, TEM-EDX images, and the like.

Hereinafter, the photoelectric conversion device 100 of an embodiment will be more specifically described with reference to examples.

Example 1

A bottom electrode of a film of elemental Mo was formed on a 16-mm-long, 12.5-mm-wide, 1.8-mm-thick, soda-lime glass by sputtering in an Ar stream. The bottom electrode had a thickness of about 500 nm. Vapor deposition of Cu, In, Ga, and Se in a desired ratio was performed to form a film on the Mo bottom electrode on the soda-lime glass. The resulting film had a thickness of about 2,200 nm. An about 30-nm-thick surface part of the film was converted to an n-type semiconductor layer, specifically, an n-type CIGS layer by a doping method. An about 25-nm-thick window layer of zinc oxide was then formed on the n-type semiconductor layer by spin coating. Subsequently, an about 285-nm-thick ZnO:Al transparent electrode was formed on the particle layer. A 2,000-nm-thick zinc oxide film was then formed as the oxide layer on the transparent electrode by spin coating. As a result, a black photoelectric conversion device of an embodiment with no interference colors was obtained. The ZnO:Al thin film used as the transparent electrode of the photoelectric conversion device had a refractive index of 2.00. A 2,000-nm-thick zinc oxide film formed on the photoelectric conversion device by spin coating had a refractive index of 1.90.

Example 2

A photoelectric conversion device of Example 2 was prepared as in Example 1, except that a 1,000-nm-thick tin-doped indium oxide film was formed as the oxide layer by a spray method. In Example 2, a black photoelectric conversion device was obtained. As measured by ellipsometry as in Example 1, the transparent electrode had a refractive index of 2.00, and the oxide layer had a refractive index of 1.95 (n (oxide layer)/n (transparent electrode)=0.975).

Example 3

A photoelectric conversion device of Example 3 was prepared as in Example 1, except that a 1,000-nm-thick zinc oxide film was formed as the oxide layer by spin coating. In Example 3, a black photoelectric conversion device was obtained. As measured by ellipsometry as in Example 1, the transparent electrode had a refractive index of 1.95, and the oxide layer had a refractive index of 1.94 (n (oxide layer)/n (transparent electrode)=0.995).

Example 4

A photoelectric conversion device of Example 4 was prepared as in Example 1, except that a 1,500-nm-thick zinc oxide film was formed as the oxide layer by a spray method. In Example 4, a black photoelectric conversion device was obtained. As measured by ellipsometry as in Example 1, the transparent electrode had a refractive index of 1.95, and the oxide layer had a refractive index of 1.97 (n (oxide layer)/n (transparent electrode)=1.01).

Example 5

A photoelectric conversion device of Example 5 was prepared as in Example 1, except that about 400-nm-thick ZnO:Al was formed as the transparent electrode on the particle layer and a 600-nm-thick zinc oxide film was formed as the oxide layer. In Example 5, a black photoelectric conversion device with faint interference colors was obtained. As measured by ellipsometry as in Example 1, the transparent electrode had a refractive index of 1.95, and the oxide layer had a refractive index of 1.90 (n (oxide layer)/n (transparent electrode)=0.974).

Example 6

A photoelectric conversion device of Example 6 was prepared as in Example 1, except that about 600-nm-thick ZnO:Al was formed as the transparent electrode on the particle layer and a 400-nm-thick zinc oxide film was formed as the oxide layer. In Example 6, a black photoelectric conversion device with faint interference colors was obtained. As measured by ellipsometry as in Example 1, the transparent electrode had a refractive index of 1.95, and the oxide layer had a refractive index of 1.90 (n (oxide layer)/n (transparent electrode)=0.974).

Example 7

A photoelectric conversion device of Example 7 was prepared as in Example 1, except that about 400-nm-thick ZnO:Al was formed as the transparent electrode on the particle layer and a 1,000-nm-thick zinc oxide film was formed as the oxide layer. In Example 7, a black photoelectric conversion device with no interference colors was obtained. As measured by ellipsometry as in Example 1, the transparent electrode had a refractive index of 2.00, and the oxide layer had a refractive index of 1.94 (n (oxide layer)/n (transparent electrode)=0.97).

Example 8

A photoelectric conversion device of Example 8 was prepared as in Example 1, except that about 285-nm-thick $In_2O_3$:Sn was formed as the transparent electrode on the particle layer and a 2,000-nm-thick tin oxide film was formed as the oxide layer. In Example 8, a black photoelectric conversion device was obtained. As measured by ellipsometry as in Example 1, the transparent electrode had a refractive index of 2.05, and the oxide layer had a refractive index of 2.00 (n (oxide layer)/n (transparent electrode)=0.976).

Comparative Example 1

A photoelectric conversion device was prepared as in Example 1, except that the oxide layer was not formed. In Comparative Example 1, a green photoelectric conversion device with interference colors was obtained. The ZnO:Al thin film used as the transparent electrode of the photoelectric conversion device had a refractive index of 2.00.

Comparative Example 2

A photoelectric conversion device was prepared as in Example 1, except that about 1,000-nm-thick ZnO:Al was formed as the transparent electrode on the window layer. As a result, a black photoelectric conversion device with no interference colors was obtained. The ZnO:Al thin film used as the transparent electrode of the photoelectric conversion device had a refractive index of 2.00.

Comparative Example 3

A photoelectric conversion device of Comparative Example 3 was prepared as in Example 1, except that about 1,000-nm-thick ZnO:Al was formed as the transparent electrode on the particle layer and a 1,000-nm-thick zirconium oxide film was formed as the oxide layer. In Comparative Example 3, a black photoelectric conversion device was obtained. As measured by ellipsometry as in Example 1, the transparent electrode had a refractive index of 1.90, and the oxide layer had a refractive index of 2.40 (n (oxide layer)/n (transparent electrode)=1.26).

Comparative Example 4

A photoelectric conversion device of Comparative Example 4 was prepared as in Example 1, except that about 285-nm-thick ZnO:Al was formed as the transparent electrode on the particle layer and an 800-nm-thick zinc oxide film was formed as the oxide layer. In Comparative Example 4, a green photoelectric conversion device with interference colors was obtained. As measured by ellipsometry as in Example 1, the transparent electrode had a refractive index of 2.10, and the oxide layer had a refractive index of 1.65 (n (oxide layer)/n (transparent electrode)=0.786).

Comparative Example 5

A photoelectric conversion device of Comparative Example 5 was prepared as in Example 1, except that about 200-nm-thick ZnO:Al was formed as the transparent electrode on the particle layer and a 200-nm-thick zinc oxide film was formed as the oxide layer. In Comparative Example 5, a blue photoelectric conversion device with interference colors was obtained. As measured by ellipsometry as in Example 1, the transparent electrode had a refractive index of 2.00, and the oxide layer had a refractive index of 1.95 (n (oxide layer)/n (transparent electrode)=0.975).

Comparative Example 6

A photoelectric conversion device of Comparative Example 6 was prepared as in Example 1, except that about 300-nm-thick ZnO:Al was formed as the transparent electrode on the particle layer and a 300-nm-thick zinc oxide film was formed as the oxide layer. In Comparative Example 6, a red photoelectric conversion device with interference colors was obtained. As measured by ellipsometry as in Example 1, the transparent electrode had a refractive index of 2.0, and the oxide layer had a refractive index of 1.95 (n (oxide layer)/n (transparent electrode)=0.975).

A voltage source and a multimeter were used under simulated sunlight AM 1.5 applied from a solar simulator. While the voltage from the voltage source was changed, the voltage at which the current was 0 mA under the simulated sunlight was measured to obtain the open circuit voltage (Voc). The current was measured when no voltage was applied, so that the short-circuit current density (Jsc) was obtained. The conversion efficiency ($\eta$=Voc·Jsc·FF/P·100 [%]) of each photoelectric conversion device was calculated from the measured values. The calculated convention efficiencies are shown in the table below.

TABLE 1

| | Conversion Efficiency (%) | Current (mA/cm$^2$) | Conversion Efficiency After Exposure to Light for 2 Hours |
|---|---|---|---|
| Example 1 | 16.9 | 34.80 | 16.5 |
| Comparative Example 1 | 15.4 | 34.07 | 15.2 |
| Comparative Example 2 | 15.7 | 34.20 | 14.9 |

Table 1 shows that the conversion efficiency of the photoelectric conversion device with the oxide layer is higher, due to an increase in the current, than that of the photoelectric conversion device without the oxide layer. This is because the photoelectric conversion device with the oxide layer according to an embodiment is black, in which interference-induced optical loss is suppressed. The photoelectric conversion device of Comparative Example 1 without the oxide layer has a green color, which is due to an optical absorption loss caused by interference. Although having a black color, the photoelectric conversion device of Comparative Example 2 has a conversion efficiency lower than that of the example. This is because of an optical absorption loss caused by strong carrier absorption at long wavelengths from around 1,100 nm in the transparent electrode. After 2-hour exposure to the simulated sunlight, the conversion efficiency of the device of Comparative Example 2 significantly decreases whereas the conversion efficiency of the devices of Example 1 and Comparative Example 1 does not significantly decrease. This is because in the device of Comparative Example 2, the amount of absorption of carriers is relatively large at long wavelengths from 1,100 nm, so that the surface temperature increases after the long-term exposure to light and thus the efficiency decreases.

Figure 3:
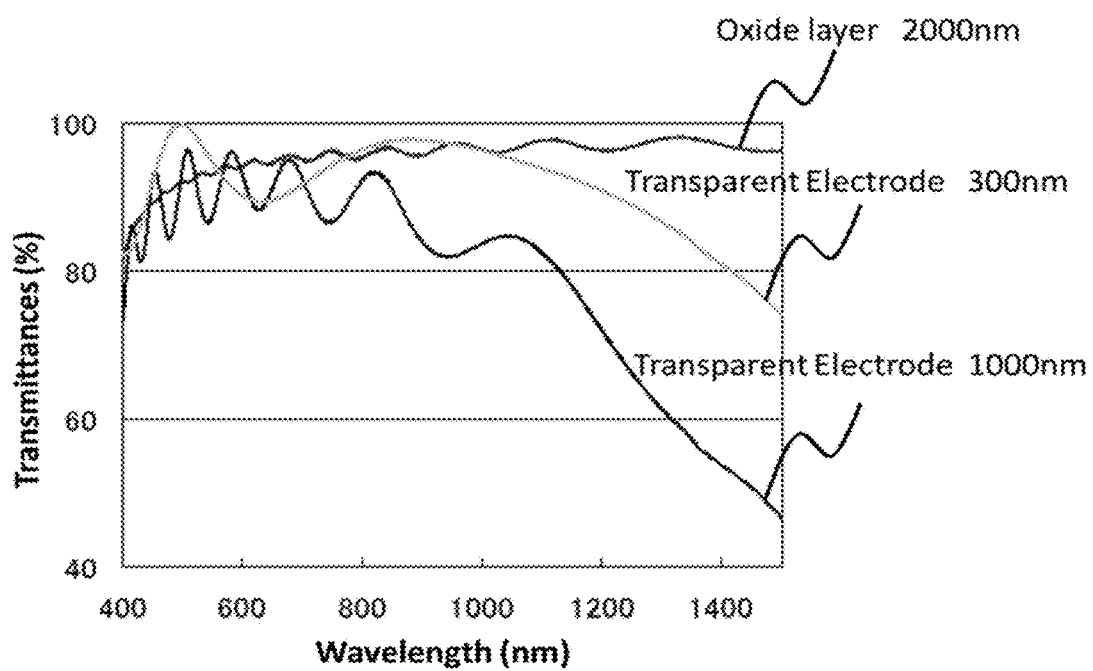
FIG. 3 is a light absorption spectrum of an oxide layer and transparent electrodes according to an embodiment.

The conversion efficiency of the photoelectric conversion device with the oxide layer is higher, due to an increase in the current, than that of the photoelectric conversion device with the 1,000-nm-thick transparent electrode layer. This is because there is no absorption in a wavelength region around 1,100 nm when the oxide layer is provided according to an embodiment, whereas an optical absorption loss occurs due to strong carrier absorption in a light region around 1,100 nm when the transparent electrode is formed with a thickness of 1,000 nm. The transmittances of glass substrates covered with a 2,000-nm-thick high-resistance oxide layer, a 300-nm-thick transparent electrode layer, and a 1,000-nm-thick transparent electrode layer, respectively, clearly show the difference in the amount of absorption in a wavelength region around 1,100 nm (see FIG. 3).

In the description, some elements are represented only by their symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion device, comprising:
a substrate;
a bottom electrode on the substrate;
a light absorbing layer on the bottom electrode;
an n-type layer on the light absorbing layer;
a window layer in direct contact with the n-type layer;
a transparent electrode in direct contact with the window layer; and
an oxide layer in direct contact with the transparent electrode,
wherein:
nA and nB satisfy the relation $100/110 \leq nB/nA \leq 110/100$;
nA is the refractive index of the transparent electrode;
nB is the refractive index of the oxide layer;
the light absorbing layer comprises a compound semiconductor of a chalcopyrite structure, a kesterite structure, or a stannite structure;
the window layer is capable of reducing leakage current from the n-type layer to the transparent electrode;
the transparent electrode is situated between the window layer and the oxide layer;
the oxide layer has a resistance higher than that of the transparent electrode;
the oxide layer consists of particles;
a resistance of the window layer is higher than that of the transparent electrode;
the transparent electrode has a thickness of less than 1 μm; and
the transparent electrode and the oxide layer have a total thickness of 1 μm or more;
wherein:
the transparent electrode comprises aluminum-doped zinc oxide or boron-doped zinc oxide and the oxide layer consists of zinc oxide; or
the transparent electrode comprises tin oxide-doped indium oxide and the oxide layer consists of indium oxide.

2. The device according to claim 1, wherein the oxide layer consists of oxide particles with an average diameter of 3 nm to 100 nm.

3. The device according to claim 1, wherein $n_A$ and $n_B$ satisfy the relation $100/105 \leq n_B/n_A \leq 105/100$.

4. The device according to claim 1, wherein the transparent electrode and the oxide layer have a total thickness of 1 μm to 2 μm.

5. A solar cell, comprising a photoelectric conversion device comprising:
a substrate;
a bottom electrode on the substrate;
a light absorbing layer on the bottom electrode;
an n-type layer on the light absorbing layer;
a window layer in direct contact with the n-type layer;
a transparent electrode in direct contact with the window layer; and
an oxide layer in direct contact with the transparent electrode,
wherein:
nA and nB satisfy the relation $100/110 \leq nB/nA \leq 110/100$;
nA is the refractive index of the transparent electrode;
nB is the refractive index of the oxide layer;
the light absorbing layer comprises a compound semiconductor of a chalcopyrite structure, a kesterite structure, or a stannite structure;
the window layer is capable of reducing leakage current from the n-type layer to the transparent electrode;
the transparent electrode is situated between the window layer and the oxide layer;
the oxide layer has a resistance higher than that of the transparent electrode;
the oxide layer consists of particles;
a resistance of the window layer is higher than that of the transparent electrode;
the transparent electrode has a thickness of less than 1 μm; and
the transparent electrode and the oxide layer have a total thickness of 1 μm or more;
wherein:
the transparent electrode comprises aluminum-doped zinc oxide or boron-doped zinc oxide and the oxide layer consists of zinc oxide; or
the transparent electrode comprises tin oxide-doped indium oxide and the oxide layer consists of indium oxide.

6. The cell according to claim 5, wherein the oxide layer consists of oxide particles with an average diameter of 3 nm to 100 nm.

7. The cell according to claim 5, wherein the transparent electrode and the oxide layer have a total thickness of 1 μm to 2 μm.

8. The device according to claim 1, wherein:
the light absorbing layer is situated between the substrate and the transparent electrode; and
the light absorbing layer is situated between the bottom electrode and the transparent electrode.

9. The cell according to claim 5, wherein:
the light absorbing layer is situated between the substrate and the transparent electrode; and
the light absorbing layer is situated between the bottom electrode and the transparent electrode.

10. The device according to claim 1, wherein the photoelectric conversion device is multi-junction type.

* * * * *